(12) United States Patent
Jiang et al.

(10) Patent No.: US 6,689,697 B1
(45) Date of Patent: Feb. 10, 2004

(54) METHOD OF FORMING UNIFORMLY PLANARIZED STRUCTURE IN A SEMICONDUCTOR WAFER

(75) Inventors: Chun Jiang, San Jose, CA (US); Yowjuang Bill Liu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 132 days.

(21) Appl. No.: 09/666,340

(22) Filed: Sep. 21, 2000

Related U.S. Application Data

(60) Provisional application No. 60/155,564, filed on Sep. 24, 1999.

(51) Int. Cl.$^7$ .............................................. H01L 21/302
(52) U.S. Cl. ........................ 438/706; 438/710; 438/712; 438/720
(58) Field of Search ................................. 438/706, 710, 438/712, 713, 782, 720, 723, 743, 618, 622

(56) References Cited

U.S. PATENT DOCUMENTS

| | | | | |
|---|---|---|---|---|
| 5,498,571 A | * | 3/1996 | Mori et al. ................... | 438/714 |
| 5,552,346 A | | 9/1996 | Huang et al. | |
| 5,639,345 A | | 6/1997 | Huang et al. | |
| 5,698,467 A | * | 12/1997 | Sakao et al. .................. | 438/723 |
| 6,110,843 A | * | 8/2000 | Chien et al. .................. | 438/782 |
| 6,117,760 A | * | 9/2000 | Gardner et al. ............. | 438/618 |

* cited by examiner

Primary Examiner—Benjamin L. Utech
Assistant Examiner—Lan Vinh

(57) ABSTRACT

A method for forming a uniformly planarized structured in a semiconductor wafer forms metal structures on a substrate layer with spaces between the structures. The top surfaces of the metal structures lie within a common plane. Dielectric material is deposited on the layer, the metal structures and in the spaces. The dielectric layer is first etched so that the dielectric material in the spaces is below the common plane. Additional dielectric material is then deposited on the layer, the metal structures and in the spaces. The dielectric layer is then subjected to a second etching. Further deposition and etching steps are performed until the top of the dielectric layer and the top surfaces of the metal structures have a common, substantially uniform planarization.

4 Claims, 3 Drawing Sheets

METHOD OF FORMING UNIFORMLY PLANARIZED STRUCTURE IN A SEMICONDUCTOR WAFER

RELATED APPLICATIONS

This application claims priority from Provisional Application Ser. No. 60/155,564, filed on Sep. 24, 1999 entitled: "METHOD OF FORMING UNIFORMLY PLANARIZED STRUCTURE IN A SEMICONDUCTOR WAFER", the entire disclosure of which is hereby incorporated by reference herein.

FIELD OF THE INVENTION

The present invention relates to a planarization process for semiconductor integrated circuit and structures, more particularly to an intermetal dielectric planarization process.

BACKGROUND OF THE INVENTION

In the formation of integrated circuit structures, layers are patterned to form active devices, such as transistors, passive devices, such as resistors, and metal lines. This patterning of layers often creates uneven surfaces which can cause problems to subsequent overlying layers and devices.

Conventionally, a layer of insulating material, such as silicon oxide, is applied over such uneven surfaces to permit the formation of overlying patterned layers. However, the insulating layer (e.g., silicon oxide) tends to conform to the underlying topography resulting in the creation of a non-planar or stepped surface. It is very difficult to pattern further layers over such an uneven surface using standard lithography techniques.

It has become a customary practice to apply planarizing layers of doped oxides, photoresist and organic-based glass materials, such as "SOG" (Spin On Glass). The insulated layer and the planarization layer are then anisotropically etched to remove the planarizing layer and raised sections of the underlying insulating layer.

One of the concerns with creating a uniformly planarized layer is that the dielectric layer, when etched so that the top surfaces of the integrated circuit structures are exposed, falls below the top surface of the integrated circuit structures. Providing a second layer of planarizing type materials such as "SOG" that fill in these depressions in the dielectric layer in between the integrated circuit structures, complicates the etch back procedure as the etching must be controlled precisely and two or more different materials must be etched. Hence, it has been difficult to achieve uniform planarization in an integrated circuit layer that employs a material such as silicon dioxide as the dielectric layer.

SUMMARY OF THE INVENTION

There is a need for a method of forming a layer in a semiconductor device that is uniformly planarized, with requiring use of multiple types of dielectric materials and planarization materials.

This and other needs are met by embodiments of the present invention which provide a method of forming a uniformly planarized structure in a semiconductor wafer. The method comprises the steps of forming metal structures on a substrate layer with spaces between the structures, the top surfaces of the metal structures lying within a common plane. A dielectric material is deposited on the layer, the metal structures and in the spaces. The dielectric layer is first etched so that the dielectric material in the spaces is below the common plane. Additional dielectric material is deposited on the layer, metal structures and in the spaces. The dielectric layer is then etched a second time. Additional dielectric material is then deposited and this material is then etched in repeating fashion until the top of the dielectric layer and the top surfaces of the metal structures have a common, substantially uniform planarization.

The multiple depositions and etchings of the dielectric layer provides a smoothing out of the topography generated due to the conformal nature of the deposition of the dielectric material and the spaces between the integrated surface structures. Repeated depositions and etchings cause the depressions in the spaces between the integrated circuit structures to be reduced with each successive deposition and etching. At some point, the conformal deposition will be relatively smooth so that subsequent etching causes the top of the dielectric layer to be coplanar with the top surfaces of the metal structures. All this is achievable with a single dielectric material, thus providing an advantage over devices that use different materials to provide the uniform planarization. Also, the use of a single material instead of multiple materials provides a uniform dielectric constant throughout the integrated circuit, in contrast to multiple materials that have different ratios of one material to the other at different circuit locations, providing different dielectric constants in those different locations.

The earlier stated needs are also met by another embodiment of the present invention which provides a method of forming a layer of a semiconductor device, comprising the steps of conformally depositing a dielectric material in a dielectric layer over and between integrated circuit (IC) structures having coplanar top surfaces. The dielectric layer is etched such that the top surfaces of the IC structures are free of the dielectric material. These two steps are repeated until the top surface of the dielectric layer between the IC surface structures is coplanar with the top surfaces of the IC surface structures.

The present invention provides the advantages of a uniformly planarized layer with integrated circuit structures and the use of a dielectric layer that does not require two different dielectric materials. The coplanar aspect of the dielectric layer and the top surfaces of the IC circuit structures is readily achieved by well known deposition and etching techniques, using common dielectric materials.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves the problems in semiconductor manufacturing related to uniform planarization in an integrated circuit layer. In order to achieve a uniform planarization of a single dielectric material with the integrated circuit structures, the present invention performs a multiple deposition and etch process, employing a single dielectric material. With each successive deposition and etch step, the dielectric material between the integrated circuit structures becomes more uniformly planarized. The deposition and etching continues until a uniform planarization is attained.

Figure 1:
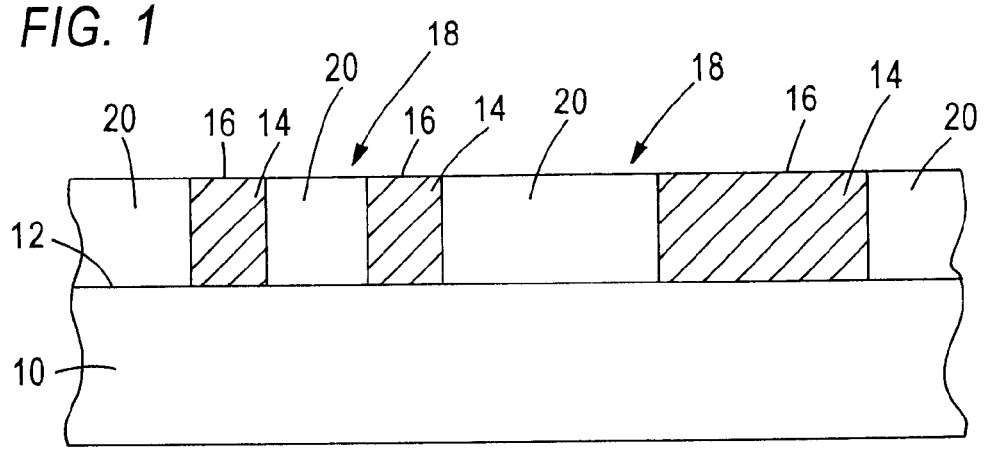
FIG. 1 depicts a schematic, cross-section of a portion of a semiconductor wafer with an integrated circuit layer formal in accordance with an embodiment of the present invention.

FIG. 1 depicts a cross-sectional view of an integrated circuit layer arrangement in accordance with the embodiments of the present invention. The arrangement includes a substrate 10 with a top substrate surface 12. Located on the top of the substrate surface 12 are integrated circuit structures 14. These integrated circuit structures may be formed by deposition techniques including evaporation, sputtering and chemical vapor deposition (CVD). Other techniques are collimated sputtering and selective CVD. Etching may be used to finalize the configuration of the integrated circuit structures 14. The etching also creates spaces 18 between the integrated surface structures 14. As depicted in FIG. 1, the sizes of the spaces vary throughout the pattern of the integrated surface structures 14.

A dielectric material 20 fills the spaces 18 between the integrated circuit structures 14. In preferred embodiments of the present invention, the dielectric material formed in the dielectric layer 20 is a single type of dielectric material, such as silicon dioxide derived from tetraethyl orthosilicate (TEOS). As can be appreciated from FIG. 1, a uniform planarization of the dielectric layer 20 with the top surfaces 16 of the integrated circuit structures 14 has been achieved. The uniform planarization allows subsequently formed layers to be formed over a smooth.

Figure 2:
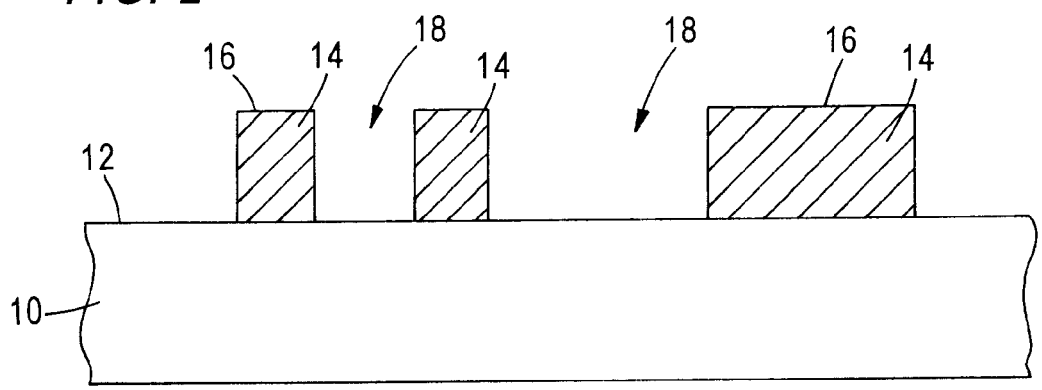
FIG. 2 is a cross-section of a substrate and integrated circuit structures used in the formation of the integrated circuit layer of FIG. 1.

FIG. 2 depicts a substrate 10 with an integrated circuit structure layer after the integrated circuit structures 14 have been formed as described above by deposition and etching, for example. These techniques are well known and need not be described.

Figure 3:
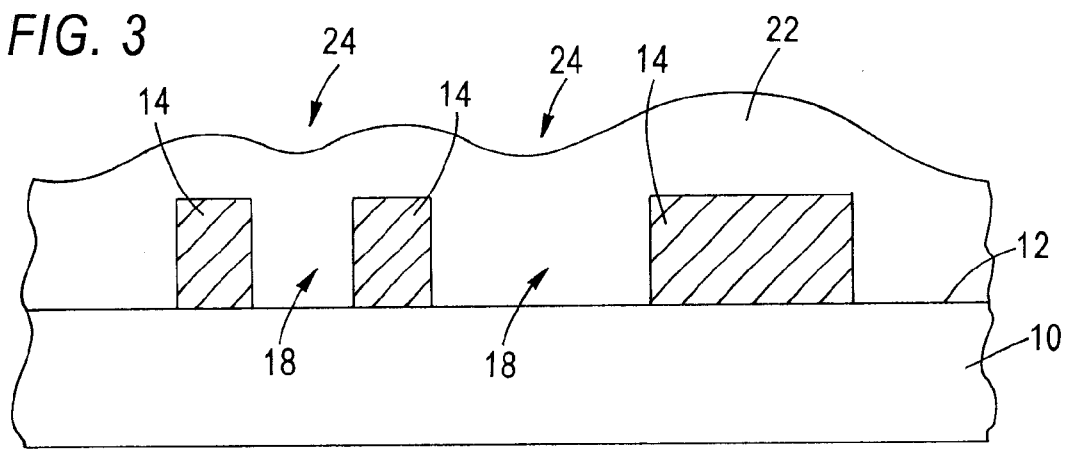
FIG. 3 depicts the arrangement of FIG. 2 following the first conformal deposition of a dielectric material over the integrated circuit structures, in accordance with an embodiment of the present invention.

The dielectric layer 22, comprising a silicon dioxide derived from TEOS, for example, is conformally deposited by well known techniques over the substrate 10 and the integrated circuit structures 14. This is depicted in FIG. 3. The spaces 18 between the structures 14 are formed by the dielectric layer 22. The conformal deposition leaves a number of depressions 24 in the top surface of the dielectric 22. There are a number of raised areas 26, corresponding to the integrated circuit structures 14.

Figure 4:
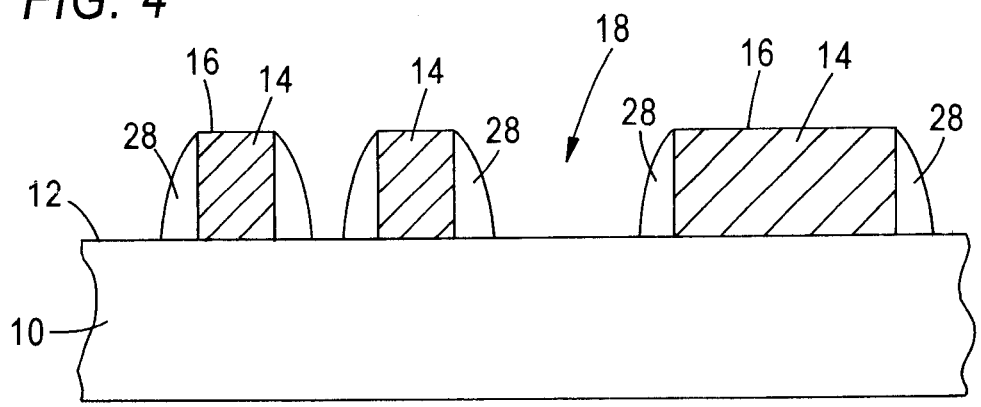
FIG. 4 shows the arrangement of FIG. 3, following the an isotropic etching procedure, in accordance with an embodiment of the present invention.

A reactive ion etching (RIE) is performed on the structure of FIG. 3 to create spacers 28, as depicted in FIG. 4, on the sides of the integrated circuit structures 14. The etching removes most of the dielectric layer 22 and opens up the spaces 18. The reactive ion etching technique is a well known etch technique that provides anisotropic etching of the dielectric layer by which the wafer is bombarded with ions and enhance or promote a reaction between an active gas and the wafer surface. Other types of anisotropic etching may also be used in other embodiments of the invention, using electrons, protons etc. to enhance a reaction between the gas and horizontal surfaces with little effect on vertical sidewalls. Hence, the sidewall spacers 28 are made of silicon dioxide, in the exemplary embodiment.

Figure 5:
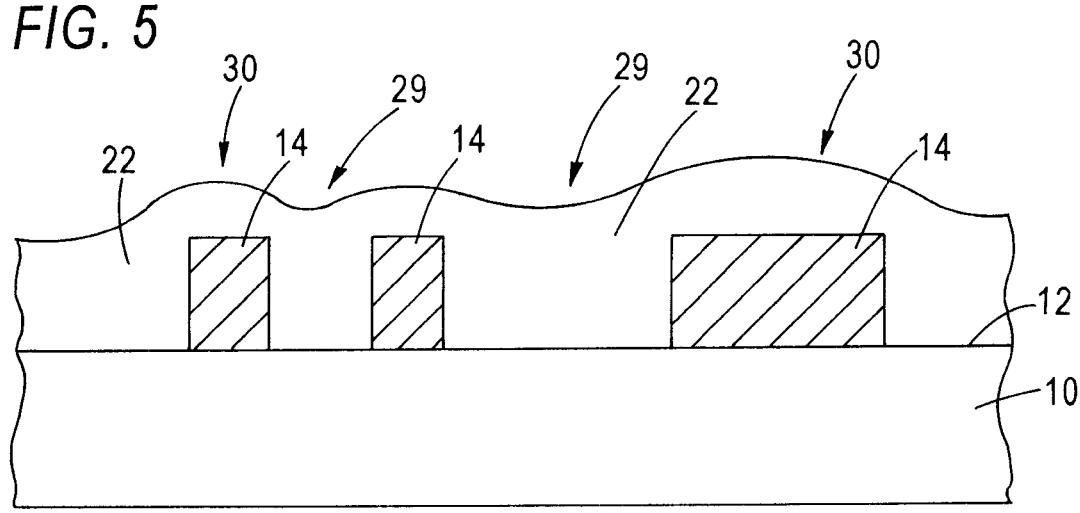
FIG. 5 depicts the arrangement of FIG. 4 after another deposition of dielectric material, in accordance with an embodiment of the present invention.

Another deposition is now performed after the anisotropic etching. As depicted in FIG. 5, the deposition of the dielectric layer 22 is a conformal deposition as in the first deposition. However, due to the presence of the spacers 28, the dielectric layer 22 now formed includes depressions 29 that are less severe than the depressions 24 in FIG. 3 and more nearly the same in height as the raised areas 30 in the dielectric layer 22 that are present over the integrated circuit structures 14.

Figure 6:
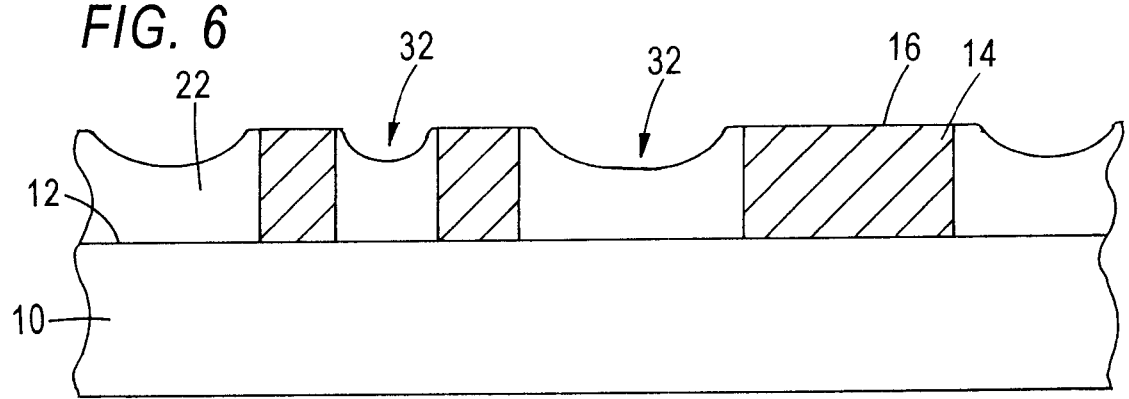
FIG. 6 shows the portion of the semiconductor wafer in FIG. 5, after an isotropic etching, in accordance with embodiments of the present invention.

The arrangement is then subjected to an isotropic etching, such as a plasma etching, to remove the dielectric material in the dielectric layer 22. Etching is continued until the top surfaces 16 of the integrated circuit structures 14 are substantially free of dielectric material. The resulting structure is depicted in FIG. 6. The dielectric layer 22 that is now present includes depressions 32 that are below the common plane formed by the top surfaces 16 of the integrated circuit structures 14. The planarity of FIG. 6 of the dielectric layer 22 and the integrated circuit structures 14 is thus improved in comparison to the planarity of FIG. 4. However, it is possible that the depressions 32 remaining in the dielectric layer 22 make the planarization achieved at this point in the deposition and etch process of the invention not as smooth as desired. Accordingly, in certain embodiments of the invention, additional deposition and etch steps are performed.

Figure 7:
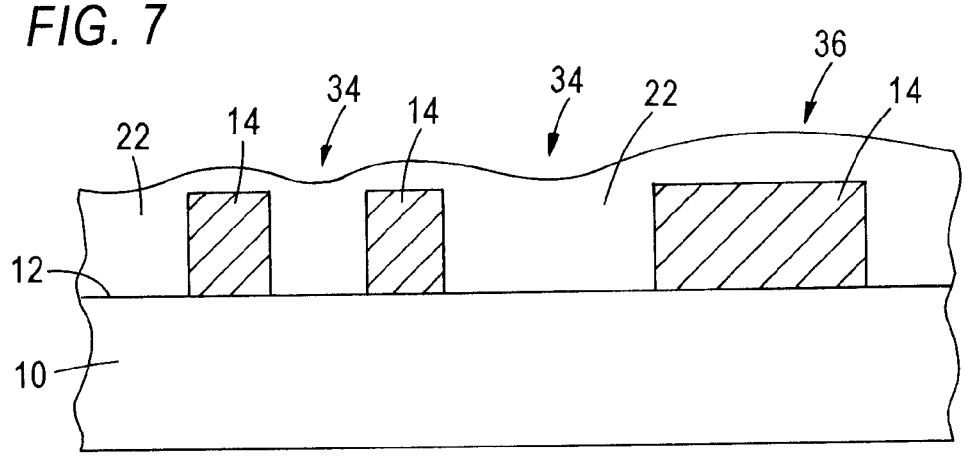
FIG. 7 depicts the arrangement of FIG. 6, following the deposition of additional dielectric material, in accordance with embodiments of the present invention.

As seen in FIG. 7, another conformal deposition of silicon dioxide derivedfroin TEOS is made over the dielectric material in the spaces 18 and the integrated circuit structures 14. A comparison of the structure of FIG. 7 with FIG. 5 reveals that the depressions 34 are less severe than the depressions 29 of FIG. 5. This is because the conformal deposition of the dielectric material over the raised depressions 32 and 36 creates a smoother topography. Similarly, the difference between the raised areas 36 of the integrated circuit structures 14 and the depressions 34 in the dielectrical layer 22. that has been deposited in FIG. 7 is not as great as the differences between the raised structures 30 and depressions 29 in the structure of FIG. 5.

Figure 8:
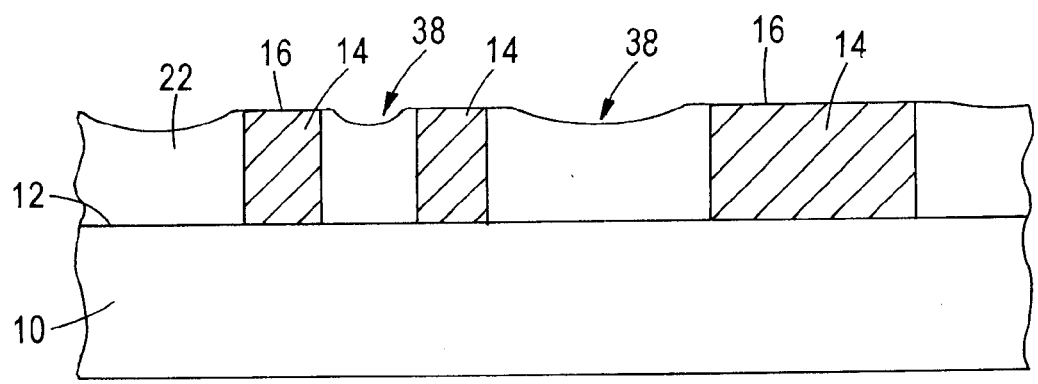
FIG. 8 depicts the arrangement of FIG. 7, following an additional isotropic etching, in accordance with embodiments of the present invention.
Figure 9:
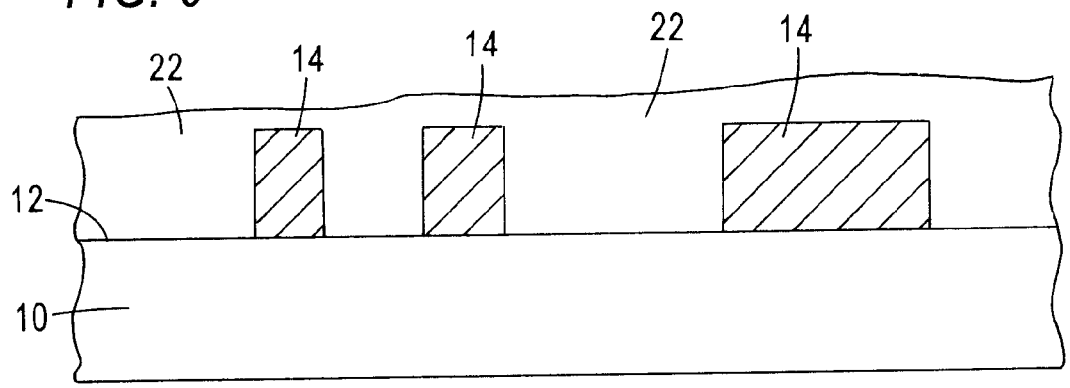
FIG. 9 shows the structure of FIG. 8 after additional dielectric material has been deposited, in accordance with embodiments of the present invention, and prior to a final isotropic etching that produces the final structure of FIG. 2.

Since the differences between the raised structures 36 and depressions 34 are very much lessened in the arrangement of FIG. 7, a subsequent isotropic etching, such as a plasma etching by known techniques, of the dielectric layer 22 results in the structure of FIG. 8. The dielectric layer 22 may still have slight depressions 38 in the spaces 18. If this level of planarization is not sufficient, a further deposition step of dielectric material is made, as depicted in FIG. 9. Dielectric layer 22, although conformally deposited, is substantially uniform as the deposition is performed over the nearly planarized spaces 18 depicted in FIG. 8.

A further isotropic etching leaves the substantially uniformly planarized structure of FIG. 1. The dielectric material 20 in the spaces 18 has a top surface coplanar with the top surfaces of the integrated circuit structures 14. This has been accomplished through the use of a single dielectric material and through individually known techniques of deposition and etching. The formation of subsequent layers on the structure of FIG. 1 does not have to contend with uneven topography as an initial starting point. Also, as only a single dielectric material has been used, a single dielectric constant throughout the layer depicted in FIG. 1 is provided.

Although the present invention has been described and illustrated in detail, it is to be clearly understood that the same is by way of illustration and example only. It is not to be taken by way of limitation, the scope of the present invention being limited only by the appendant claims.

What is claimed is:

1. A method of forming a uniformly planarized structure in a semiconductor wafer, comprising the steps of:

a) forming metal structures on a substrate layer with spaces between the structures, the top surfaces of the metal structures lying within a common plane;

b) depositing dielectric material on the layer, the metal structures and in the spaces;

c) first etching the dielectric layer such that the dielectric material in the spaces is below the common plane until spacers are formed on the walls of the metal structures and the top surfaces of the metal structures are free of dielectric material;

d) depositing additional dielectric material on the layer, the metal structures and in the spaces;

e) second etching the dielectric layer until the top surface of the metal structures are free of dielectric material; and f) repeating steps d) and e) until the top of the dielectric layer and the top surfaces of the metal structures have a common substantially uniform planarization.

2. The method of claim 1, wherein the first etching of the dielectric layer comprises reactive ion etching (RIE).

3. The method of claim 2, wherein the second etching and additional etching of the dielectric layers comprises plasma etching.

4. The method of claim 3, wherein the dielectric material is silicon dioxide derived from tetraethyl orthosilicate (TEOS).

* * * * *